United States Patent
Agatani et al.

(10) Patent No.: US 9,024,334 B2
(45) Date of Patent: May 5, 2015

(54) LIGHT-EMITTING DEVICE HAVING A PLURALITY OF CONCENTRIC LIGHT TRANSMITTING AREAS

(75) Inventors: Makoto Agatani, Osaka (JP); Toshio Hata, Osaka (JP); Toyonori Uemura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 479 days.

(21) Appl. No.: 12/942,327

(22) Filed: Nov. 9, 2010

(65) Prior Publication Data
US 2011/0116252 A1 May 19, 2011

(30) Foreign Application Priority Data
Nov. 13, 2009 (JP) .................. 2009-260123

(51) Int. Cl.
*H01L 29/18* (2006.01)
*F21K 99/00* (2010.01)
*H01L 25/075* (2006.01)
*H05K 1/03* (2006.01)
*H05K 1/16* (2006.01)
*H05K 1/18* (2006.01)

(52) U.S. Cl.
CPC ............ *F21K 9/00* (2013.01); *H05K 1/0306* (2013.01); *H05K 1/167* (2013.01); *H05K 1/181* (2013.01); *H05K 2201/10106* (2013.01); *H01L 25/0753* (2013.01); *H01L 2224/48091* (2013.01)

(58) Field of Classification Search
CPC . H01L 51/56; H01L 27/12; H01L 2251/5315; H01L 51/52; H01L 25/167; H01L 2224/48091; H01L 33/483; H01L 51/5012; F21Y 2101/02; F21Y 2103/022; F21Y 2105/001; F21Y 2105/00; F21Y 2111/002; F21Y 2111/004; F21Y 2113/005
USPC .................. 257/88, 100; 438/28; 362/84
See application file for complete search history.

(56) References Cited

U.S. PATENT DOCUMENTS

| | | | |
|---|---|---|---|
| 6,008,582 A * | 12/1999 | Asano et al. .................. 313/582 |
| 6,583,550 B2 | 6/2003 | Iwasa et al. |
| 6,942,360 B2 | 9/2005 | Chou et al. |
| 7,675,075 B2 | 3/2010 | Nagai |
| 8,049,237 B2 | 11/2011 | Yamada et al. |
| 2004/0113267 A1 | 6/2004 | Yogo et al. |
| 2006/0049423 A1* | 3/2006 | Yamaguchi et al. .......... 257/100 |

(Continued)

FOREIGN PATENT DOCUMENTS

| CN | 1909238 A | 2/2007 |
| CN | 101944565 A | 1/2011 |

(Continued)

OTHER PUBLICATIONS

U.S. Office Action mailed Mar. 21, 2012 in U.S. Appl. No. 12/827,319.

(Continued)

*Primary Examiner* — Duy T Nguyen
(74) *Attorney, Agent, or Firm* — Nixon & Vanderhye P.C.

(57) ABSTRACT

The light-emitting device of the present invention includes LED chips provided on a ceramic substrate and a sealing material in which the LED chips are embedded. The sealing material contains a fluorescent substance and divided into a first fluorescent-substance-containing resin layer and a second fluorescent-substance-containing resin layer by a first resin ring and a second resin ring.

14 Claims, 18 Drawing Sheets

(56) References Cited

U.S. PATENT DOCUMENTS

| | | | |
|---|---|---|---|
| 2007/0030611 A1 | 2/2007 | Cho et al. | |
| 2007/0041185 A1 | 2/2007 | Yatsuda et al. | |
| 2007/0103939 A1 | 5/2007 | Huang et al. | |
| 2007/0194422 A1 | 8/2007 | Lai et al. | |
| 2008/0128739 A1 | 6/2008 | Sanpei et al. | |
| 2008/0211388 A1* | 9/2008 | Okimura | 313/503 |
| 2008/0224608 A1 | 9/2008 | Konishi et al. | |
| 2008/0231169 A1 | 9/2008 | Hata et al. | |
| 2009/0046456 A1* | 2/2009 | Urano et al. | 362/235 |
| 2009/0108271 A1* | 4/2009 | Chou et al. | 257/88 |
| 2009/0166657 A1 | 7/2009 | Jamada et al. | |
| 2009/0267099 A1* | 10/2009 | Sakai | 257/98 |
| 2009/0296414 A1* | 12/2009 | Moriyama et al. | 362/373 |
| 2010/0084683 A1 | 4/2010 | Lai et al. | |
| 2010/0128461 A1* | 5/2010 | Kim et al. | 362/84 |
| 2010/0301731 A1 | 12/2010 | Morikawa et al. | |
| 2010/0320483 A1 | 12/2010 | Kadotani et al. | |
| 2011/0001156 A1 | 1/2011 | Matsuda et al. | |
| 2011/0050071 A1 | 3/2011 | Chung et al. | |
| 2011/0316011 A1 | 12/2011 | Ito et al. | |
| 2012/0007112 A1 | 1/2012 | Jamada et al. | |

FOREIGN PATENT DOCUMENTS

| | | |
|---|---|---|
| CN | 102334201 A | 1/2012 |
| JP | 56-84368 | 7/1981 |
| JP | 59-18454 U | 2/1984 |
| JP | 60-179057 U | 11/1985 |
| JP | 5-29665 A | 2/1993 |
| JP | 6-318732 A | 11/1994 |
| JP | 7-273371 A | 10/1995 |
| JP | 63-180957 U | 11/1998 |
| JP | 11-191634 A | 7/1999 |
| JP | 11-298041 A | 10/1999 |
| JP | 11-307815 A | 11/1999 |
| JP | 2002-312892 A | 10/2002 |
| JP | 2003-218397 A | 7/2003 |
| JP | 2006-93697 A | 4/2006 |
| JP | 2006093697 * | 4/2006 |
| JP | 2007-043046 A | 2/2007 |
| JP | 2007-116095 | 5/2007 |
| JP | 2007-227882 A | 9/2007 |
| JP | 2007-250899 A | 9/2007 |
| JP | 2007-294547 | 11/2007 |
| JP | 2007-311398 A | 11/2007 |
| JP | 2007-324205 A | 12/2007 |
| JP | 2008-60129 A | 3/2008 |
| JP | 2008-84943 A | 4/2008 |
| JP | 2008-85109 A | 4/2008 |
| JP | 2008-235680 A | 10/2008 |
| JP | 2008-235719 A | 10/2008 |
| JP | 2008-235824 A | 10/2008 |
| JP | 2009-88190 A | 4/2009 |
| JP | 2009-135485 A | 6/2009 |
| JP | 2009-164157 A | 7/2009 |
| JP | 2009-206383 A | 9/2009 |
| JP | 2009-231148 A | 10/2009 |
| JP | 2009-290244 A | 12/2009 |
| JP | 3156708 U | 1/2010 |
| JP | 2011-009298 A | 1/2011 |
| JP | 2011-014878 A | 1/2011 |
| JP | 2011-049516 A | 3/2011 |
| WO | WO 2008/069204 A1 | 6/2008 |
| WO | 2008/091837 A3 | 7/2008 |
| WO | WO 2009/146257 A1 | 12/2009 |

OTHER PUBLICATIONS

Notification of Reasons for Refusal mailed Jun. 18, 2013 in Japanese Application No. 2010-012486, with English Translation.

Office Action mailed Jun. 21, 2013 in co-pending U.S. Appl. No. 13/799,373.

Japanese Office Action mailed May 28, 2013 in Japanese Patent Application 2009-157133.

Decision to Dismiss the Amendment mailed Nov. 26, 2013 in Japanese Application No. 2009-157133, with English Translation (4 pages).

Notice of Allowance mailed Dec. 26, 2013 in U.S. Appl. No. 13/799,373 (8 pages).

Office Action mailed Sep. 30, 2013 in U.S. Appl. No. 13/799,373.

Office Action issued in Japanese Patent Application No. 2013-165596 dated Sep. 9, 2014 (w/ translation).

* cited by examiner

Conventional Art

US 9,024,334 B2

LIGHT-EMITTING DEVICE HAVING A PLURALITY OF CONCENTRIC LIGHT TRANSMITTING AREAS

This Nonprovisional application claims priority under 35 U.S.C. §119(a) on Patent Application No. 2009-260123 filed in Japan on Nov. 13, 2009, the entire contents of which are hereby incorporated by reference.

TECHNICAL FIELD

The present invention relates to a light-emitting device and a method for producing the light-emitting device.

BACKGROUND ART

In recent years, LEDs have been widely used as light sources of light-emitting devices. In order to obtain white light by a light-emitting device including LEDs, a method can be employed in which, for example, (i) three types of LEDs (red LED, blue LED, and green LED) are used, or (ii) a blue LED is used as a light source for a yellow fluorescent substance. It is demanded that a light-emitting device is capable of emitting white light with sufficient luminance. In view of this, a light-emitting device including a plurality of LED chips has been commercialized.

Patent Literature 1 discloses a technique to improve efficiency of extracting light from a whole device. Specifically, a plurality of LED chips 520 are provided on a base substrate 510 in such a manner that every corner of each of the plurality of LED chips faces a corner of the adjacent one of the plurality of LED chips (see FIG. 20). With the arrangement, a distance between sides of adjacent ones of the plurality of LED chips 520 can be increased without changing center positions of respective ones of the plurality of LED chips 520, as compared to a configuration in which the same number of the plurality of LED chips 520 are arranged on the base substrate 510 in a matrix manner. This makes it possible, without enlarging a size of the base substrate 510, to prevent light emitted by each of the plurality of LED chips 520 from being absorbed and confined by the adjacent LED chips 520. Accordingly, efficiency of extracting light of the whole device can be improved.

Moreover, Patent Literature 1 also discloses a technique to reduce unevenness of chromaticity by the use of a dome-shaped color converting member which is provided in such a manner that an air layer is provided between the color converting member and an optical member.

CITATION LIST

Patent Literature 1

Japanese Patent Application Publication, Tokukai, No. 2007-116095 (Publication Date: May 10, 2007)

SUMMARY OF INVENTION

Technical Problem

However, the technique to reduce unevenness of chromaticity disclosed in Patent Literature 1 relates to a technique to reduce unevenness of chromaticity of a whole light-emitting surface of a single light-emitting device, and Patent Literature 1 is totally silent about a technique to prevent unevenness of chromaticities of respective light-emitting devices.

According to the conventional technique, unevenness of chromaticity of a whole light-emitting surface of a single light-emitting device can be reduced but unevenness of chromaticities of respective light-emitting devices cannot be suppressed.

The present invention is accomplished for solving the problem, and its main object is to cheaply provide light-emitting devices whose chromaticities are not varied so much because the chromaticities are adjusted while producing the light-emitting devices.

Solution to Problem

In order to attain the object, a light-emitting device of the present invention includes: a plurality of light-emitting elements provided on a substrate; and a sealing material in which the plurality of light-emitting elements are embedded, the sealing material containing a fluorescent substance and being divided into a plurality of areas by a partition wall.

According to the configuration, the sealing material is divided into the plurality of areas. This makes it possible to produce the light-emitting device by providing one of the sealing materials in one area and measuring a chromatic characteristic, and then providing another one of the sealing materials in the other area based on the measurement result. Accordingly, it is possible to provide the light-emitting devices in which chromaticities are adjusted so that unevenness of chromaticities among the light-emitting devices is reduced. Moreover, in producing the light-emitting devices, it is possible to control the number of products to be discarded due to nonconformity to a desired chromaticity, and whereby a unit price of the product can be suppressed. Accordingly, the light-emitting device can be provided at low cost.

In order to attain the object, a method for producing a light-emitting device of the present invention includes the steps of: (a) providing a plurality of light-emitting elements on a substrate; (b) providing a partition wall on the substrate; (c) providing a first sealing material containing a fluorescent substance in one of areas separated by the partition wall; (d) measuring a chromatic characteristic of the light-emitting device in which the first sealing material has been provided; (e) in accordance with a result of the measurement, providing a second sealing material containing a fluorescent substance in other one of the areas separated by the partition wall; and (f) measuring the chromatic characteristic of the light-emitting device in which the second sealing material has been provided.

According to the configuration, the step of measuring a chromatic characteristic of the light-emitting device in which the first sealing material has been provided and the step of providing the second sealing material in accordance with the measurement result are separated. This makes it possible to closely adjust a chromaticity in producing the light-emitting device. Accordingly, it is possible to control the number of products to be discarded due to nonconformity to a desired chromaticity, and whereby a unit price of the product can be suppressed. This makes it possible to easily produce the light-emitting devices at low cost among which unevenness of chromaticities of the light-emitting devices is reduced.

Advantageous Effects of Invention

The light-emitting device of the present invention includes: a plurality of light-emitting elements provided on a substrate; and a sealing material in which the plurality of light-emitting elements are embedded, the sealing material containing a fluorescent substance and being divided into a plurality of areas by a partition wall.

According to the configuration, the sealing materials are separated into a plurality of areas. Accordingly, it is possible that one of the sealing materials is provided in one of the plurality of areas and a chromatic characteristic is measured, and then the other one of the sealing materials is provided in the other one of the plurality of areas in accordance with the measurement result. Further, it is possible to (i) adjust a chromaticity, reduce unevenness of chromaticities among the light-emitting devices, and (ii) provide the light-emitting device at low cost.

DESCRIPTION OF EMBODIMENTS

Embodiment 1

The following describes an embodiment of the present invention with reference to FIGS. 1 through 7.
[Configuration of Light-Emitting Device 100]

Figure 1:
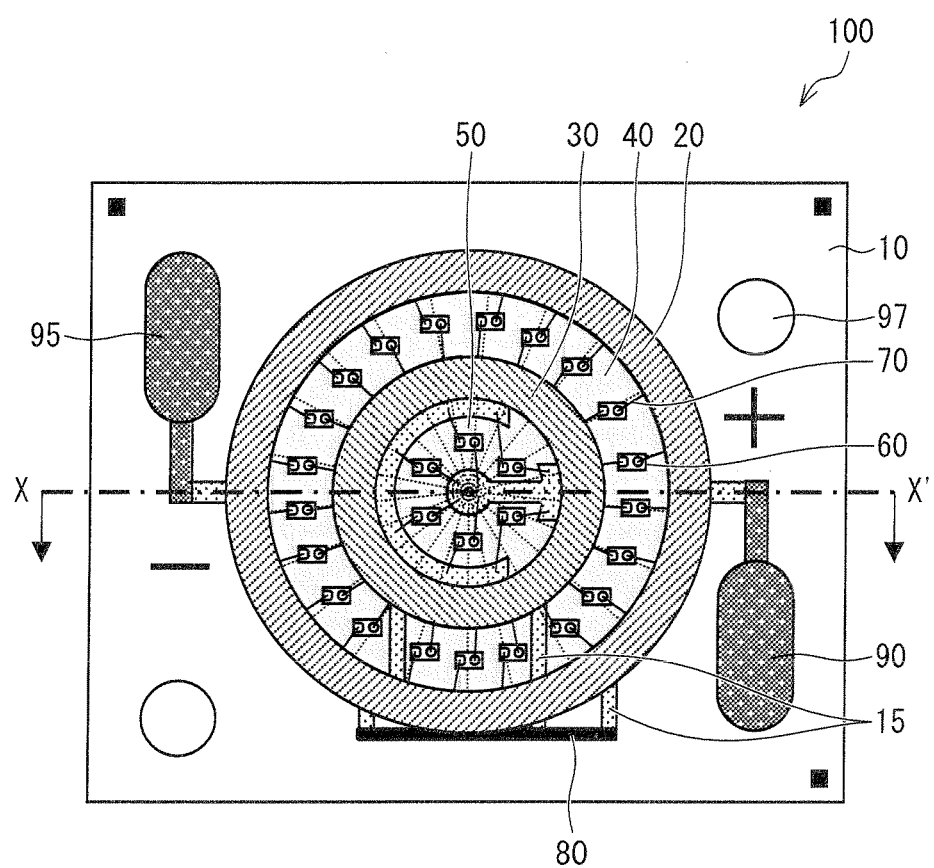
FIG. 1 is a top view illustrating a light-emitting device of Embodiment 1.

FIG. 1 is a top view illustrating a configuration example of a light-emitting device 100 (light-emitting device) of the present embodiment. As shown in FIG. 1, the light-emitting device 100 includes a ceramic substrate 10 (substrate), a patterned electrode wire 15 (patterned wire), LED chips 60 (light-emitting elements), a first fluorescent-substance-containing resin layer 40 (sealing material, first sealing material), a second fluorescent-substance-containing resin layer 50 (sealing material, second sealing material), a first resin ring 20 (partition wall), and a second resin ring 30 (partition wall).

Figure 2:
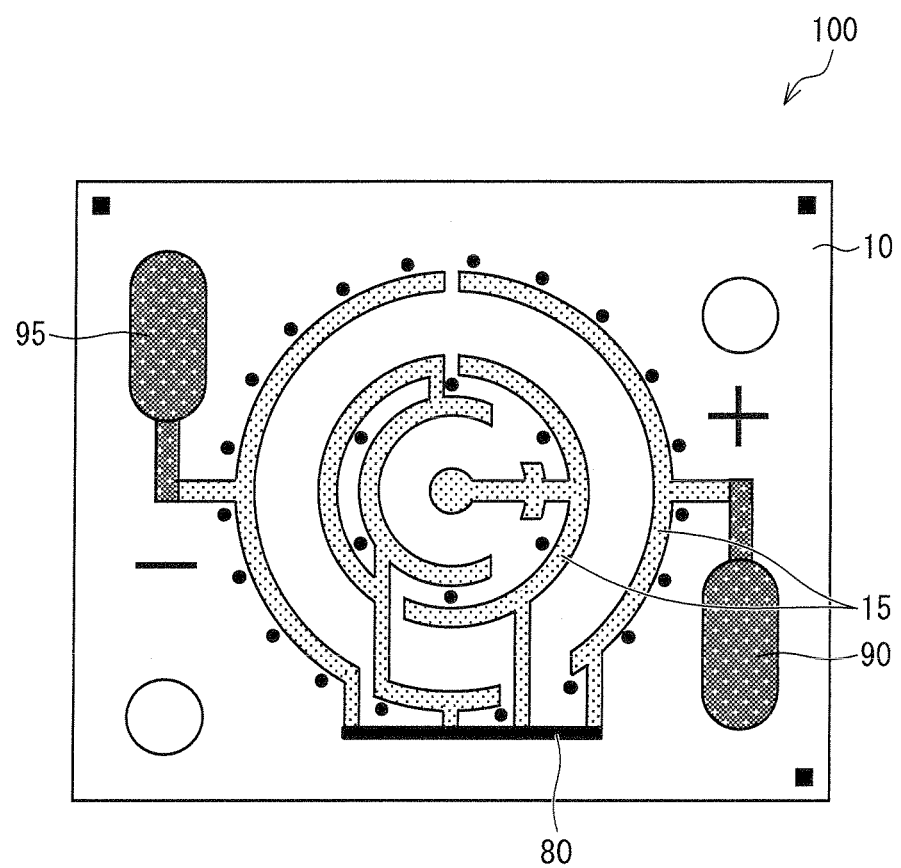
FIG. 2 is a top view illustrating a wiring pattern of the light-emitting device of Embodiment 1.
Figure 3:
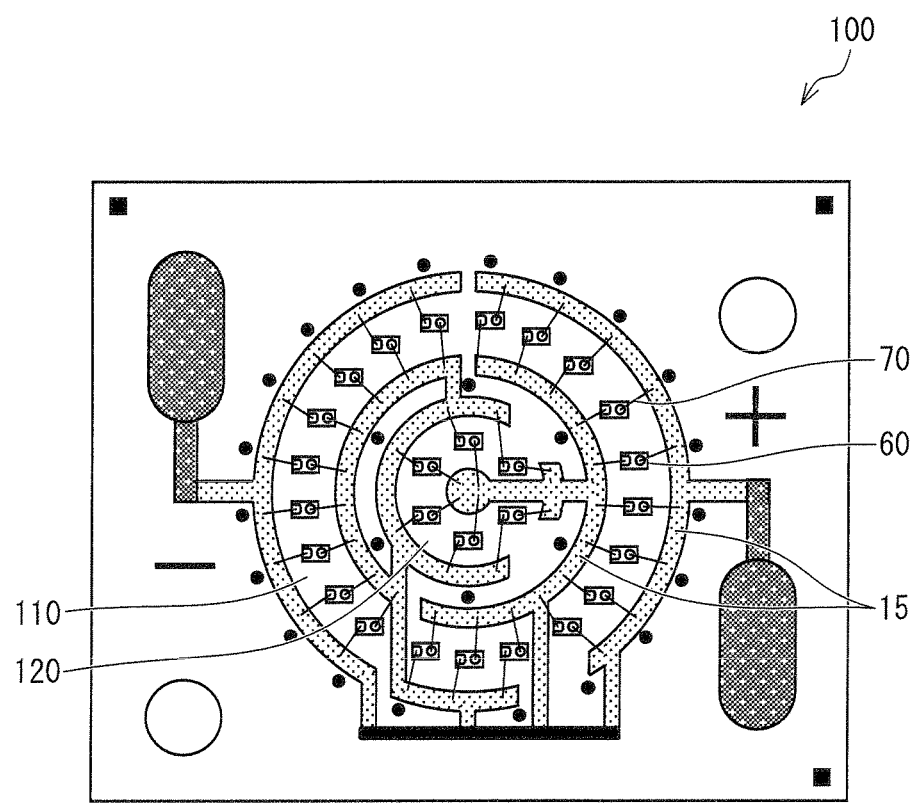
FIG. 3 is a top view illustrating an arrangement of LED chips in the light-emitting device of Embodiment 1.
Figure 5:
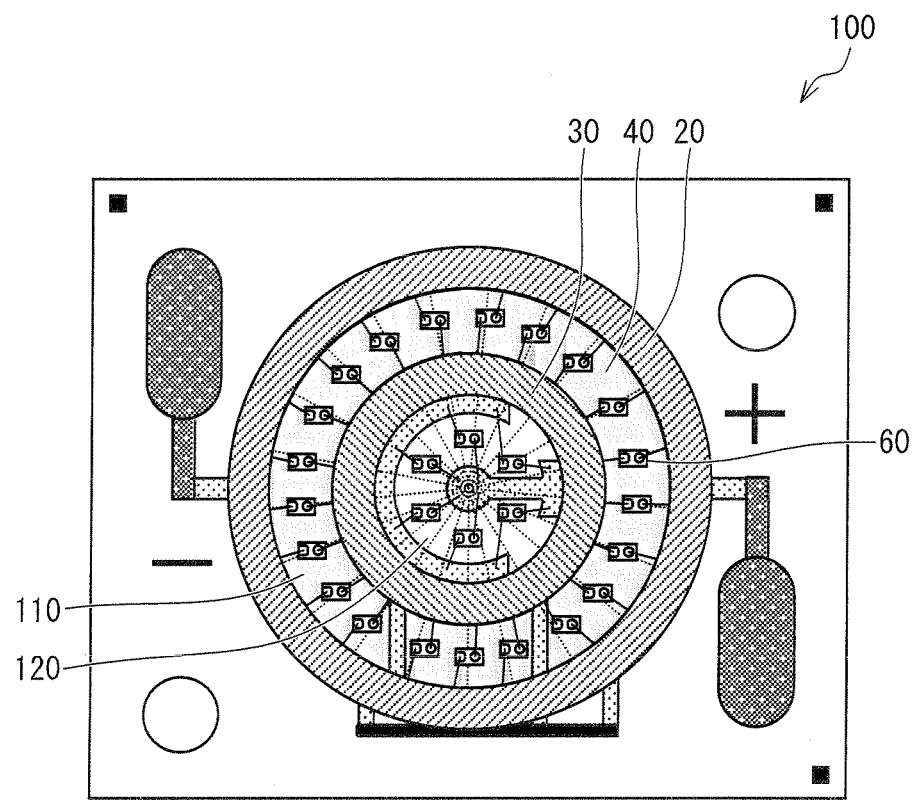
FIG. 5 is a top view illustrating a configuration in a first measurement of the light-emitting device of Embodiment 1.
Figure 6:
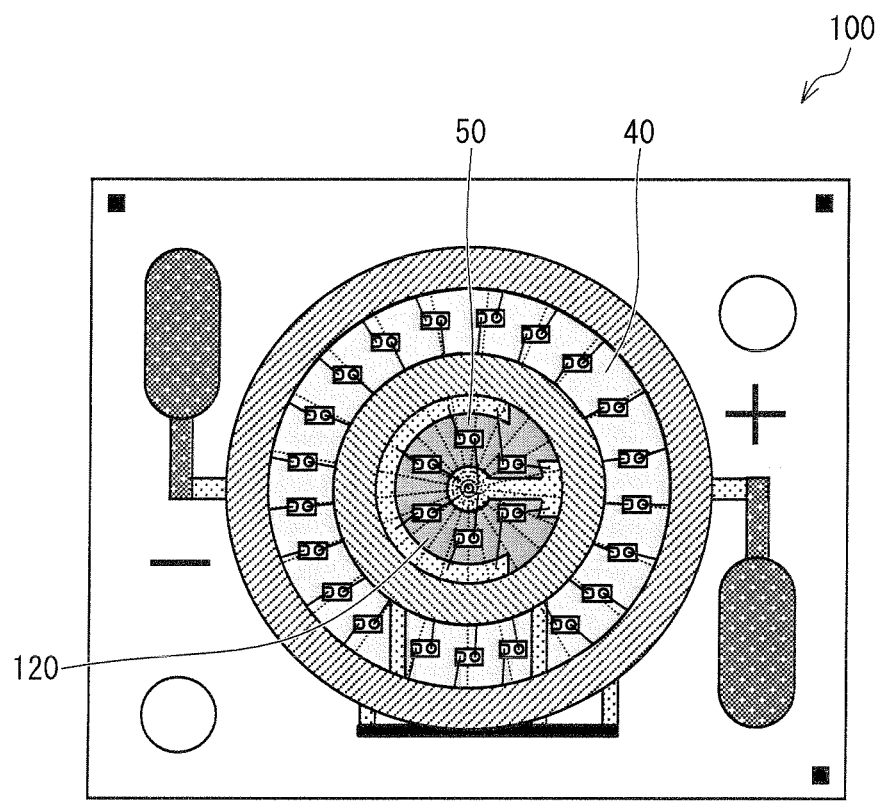
FIG. 6 is a top view illustrating a configuration in a second measurement of the light-emitting device of Embodiment 1.
Figure 7:
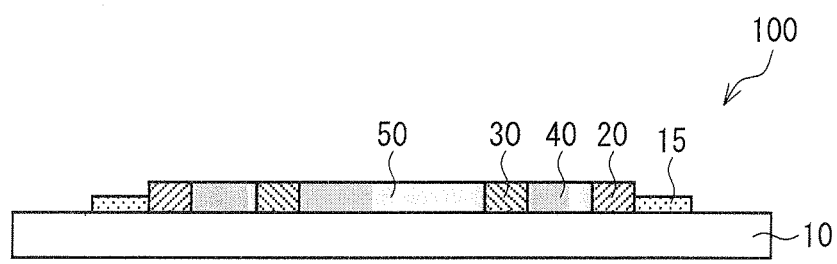
FIG. 7 is a cross-sectional view taken along the line X-X' of FIG. 1.

FIG. 2 is a top view illustrating a configuration in which the ceramic substrate 10 is provided with the patterned electrode wire 15, an electrode land (anode) 90, an electrode land (cathode) 95, and a printed resistance element 80. FIG. 3 is a top view illustrating a configuration in which the LED chips 60 are connected to the patterned electrode wire 15 via wires 70. FIG. 5 is a top view illustrating a configuration in which the first fluorescent-substance-containing resin layer 40 is provided in a first area 110 (area). FIG. 6 is a view illustrating a configuration in which the second fluorescent-substance-containing resin layer 50 is provided in a second area 120 (area). FIG. 7 is a cross-sectional view taken along the line X-X' of FIG. 1.
(Ceramic Substrate 10)

The ceramic substrate 10 is a substrate on which the LED chips 60, etc. are provided. As shown in FIG. 1, the electrode land (anode) 90, the electrode land (cathode) 95, and the printed resistance element 80 are provided on the ceramic substrate 10. Moreover, the ceramic substrate 10 has holes 97 for mounting a substrate.

According to the present embodiment, the ceramic substrate 10 has a rectangular shape of 12 mm×15 mm with a thickness of 1 mm. Note that a shape of the substrate included in the light-emitting device of the present invention is not limited to this. In the present embodiment, each of the holes 97 for mounting a substrate is a circular hole having a diameter of 1.4 mm and two of the holes 97 for mounting a substrate are provided at opposing corners of the ceramic substrate 10 so that the light-emitting device 100 can be fixed. Note that, in a case where a hole for mounting a substrate is formed in a substrate included in the light-emitting device of the present invention, a diameter of the hole is not limited to the above described diameter.

Note that, even though the ceramic substrate 10 is used in the present embodiment, a material of the substrate is not limited to ceramic. For example, it is possible to use a metal substrate having a surface on which an insulating layer is provided.
(Patterned Electrode Wire 15)

As shown in FIG. 2, the patterned electrode wire 15 is a patterned Au electrode which is provided on the main surface of the ceramic substrate 10 and has a width of 300 μm and a thickness of 10 μm. The patterned electrode wire 15 is connected with the electrode land (anode) 90, the electrode land (cathode) 95, and the printed resistance element 80. Each of the electrode land (anode) 90 and the electrode land (cathode) 95 (i) is made of Ag—Pt, (ii) has a thickness of 20 μm, and (iii) has a shape made up of a rectangular part and two half round parts having diameters of 1.4 mm between which the rectangular part is provided. The rectangular part has sides of 2 mm and 1.4 mm, which sides of 1.4 mm correspond to the respective diameters of the round parts. Note that, in a case where an electrode land is provided on a substrate included in the light-emitting device of the present invention, a shape and a size of the electrode land are not limited to those described above.

Moreover, the patterned electrode wire 15 connects anode-side electrodes of the LED chips 60 to the electrode land (anode) 90. The electrode land (anode) 90 is disposed in an edge area of the main surface of the ceramic substrate 10. Moreover, the patterned electrode wire 15 connects cathode-side electrodes of the LED chips 60 to the electrode land (cathode) 95 provided on the ceramic substrate 10. The electrode land (cathode) 95 is provided in an edge area opposite to the edge area in which the electrode land (anode) 90 is provided.

(Printed Resistance Element 80)

The printed resistance element 80 is not limited in particular in terms of its shape and material. In the present embodiment, the printed resistance element 80 is made of ruthenium oxide $RuO_2$ and has a width of 300 μm, a thickness of 10 μm, and a resistance of 1 MΩ. Moreover, the printed resistance element 80 is also not limited in terms of its color. In the present embodiment, the printed resistance element 80 is black. Note that the light-emitting device of the present invention can include a protective element instead of or in addition to the printed resistance element.

(Led Chip 60)

As shown in FIG. 3, the LED chips 60 are connected to the patterned electrode wire 15 via the wires 70. On the main surface of the ceramic substrate 10, 21 pieces of the LED chips 60 are provided in the first area 110 and 6 pieces of the LED chips 60 are provided in the second area 120. In the present embodiment, each of the LED chips 60 has a width of 240 μm, a length of 400 μm, and a height of 80 μm. Note that the first area 110 is an area between the first resin ring 20 and the second resin ring 30. The second area 120 is an area inside the second resin ring 30.

Figure 4:
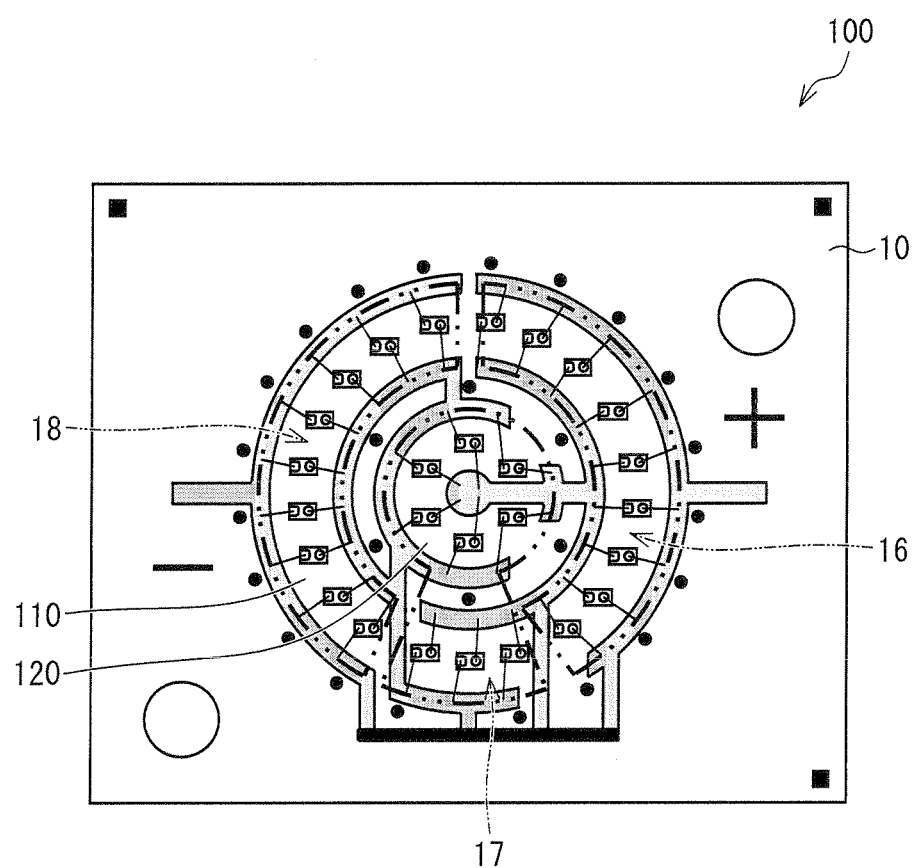
FIG. 4 is a top view illustrating areas in which the LED chips are arranged in the light-emitting device of Embodiment 1.

As shown in FIG. 4, the area in which the LED chips 60 are provided is divided in to three areas by the patterned electrode wire 15. A first electric area 16 encompasses 9 pieces among the LED chips 60 provided in the first area 110. A second electric area 17 encompasses 3 pieces among the LED chips 60 provided in the first area 110 and 6 pieces among the LED chips 60 provided in the second area 120. A third electric area 18 encompasses 9 pieces among the LED chips 60 provided in the first area 110.

(First Resin Ring 20 and Second Resin Ring 30)

As shown in FIG. 5, the first resin ring 20 and the second resin ring 30 separate, into areas, fluorescent-substance-containing resins which are sealing materials covering the LED chips 60. In the present embodiment, the first resin ring 20 and the second resin ring 30 separates the first area 110 and the second area 120.

Each of the first resin ring 20 and the second resin ring 30 is a ring-shaped member made of a white silicon resin which contains titanic oxide $TiO_2$ as a filler. Alternatively, each of the first resin ring 20 and the second resin ring 30 can be a ring-shaped member to which white solder mask is applied. Note that the filler used in the first resin ring 20 and the second resin ring 30 is not limited to the titanic oxide $TiO_2$. Moreover, the first resin ring 20 and the second resin ring 30 serve to hold shapes of the first fluorescent-substance-containing resin layer 40 and the second fluorescent-substance-containing resin layer 50 by damming the fluorescent-substance-containing resin poured into the first area 110 and the second area 120 in producing the first fluorescent-substance-containing resin layer 40 and the second fluorescent-substance-containing resin layer 50. That is, the first area 110 is an area in which the first fluorescent-substance-containing resin layer 40 is provided, and the second area 120 is an area in which the second fluorescent-substance-containing resin layer 50 is provided.

Note that, in the present embodiment, colors of the silicon resin and the solder mask are white which are used in each of the first resin ring 20 and the second resin ring 30. However, the color is not limited to white but can be milky white.

In the present embodiment, the first resin ring 20 has a circular shape with a ring width of 0.5 mm and a ring diameter of 8.6 mm. The second resin ring 30 has a circular shape with a ring width of 0.5 mm and a ring diameter of 3.9 mm. In the present embodiment, the first resin ring 20 and the second resin ring 30 are concentrically arranged. Note that, in the present embodiment, the first resin ring 20 and the second resin ring 30 having circular shapes are discussed. However, the first resin ring 20 and the second resin ring 30 can be a cyclic polygon.

Note that it is preferable that each of the first resin ring 20 and the second resin ring 30 includes at least one of a thickener and a diffusing agent.

(First Fluorescent-Substance-Containing Resin Layer 40 and Second Fluorescent-Substance-Containing Resin Layer 50)

As shown in FIGS. 5 and 6, the first fluorescent-substance-containing resin layer 40 and the second fluorescent-substance-containing resin layer 50 are formed by filling the fluorescent-substance-containing resin which is the sealing material covering the LED chips 60.

Note that each of the first fluorescent-substance-containing resin layer 40 and the second fluorescent-substance-containing resin layer 50 can contain a plurality of fluorescent substances. Moreover, at least one of an amount and a composition of the fluorescent substance contained in the first fluorescent-substance-containing resin layer 40 can be different from that of the fluorescent substance contained in the second fluorescent-substance-containing resin layer 50. In the present embodiment, each of the first fluorescent-substance-containing resin layer 40 and the second fluorescent-substance-containing resin layer 50 contains a green fluorescent substance of $Ca_3(Sr.Mg)_2Si_3O_{12}:Ce$, and a red fluorescent substance of $(Sr.Ca)AlSiN_3:Eu$. Note that the type of the fluorescent substance is not limited in particular.

In the present embodiment, only a single first fluorescent-substance-containing resin layer 40 having a circular shape is provided for example. However, the number of the fluorescent substance containing resin layer is not limited to this, but a plurality of circular fluorescent substance containing resin layers can be provided concentrically. A light-emitting device having such a configuration can be suitably used as (i) a light source of an illuminating device having a circular shape with respect to its light emitting face, or (ii) a light source of an illuminating device which needs to be optically connected with an external optical component appropriately. The illuminating device having a circular shape with respect to its light emitting face can be, for example, a bulb-type illuminating device. Moreover, the illuminating device which needs to be optically connected with an external optical component appropriately can be, for example, an illuminating device which is provided with an external lens for adjusting a light distribution characteristic which external lens is provided directly above the illuminating device.

[Method for Producing Light-Emitting Device 100]

A method for producing the light-emitting device 100 of the present embodiment includes the steps of: providing the plurality of LED chips 60 on the ceramic substrate 10; providing the first resin ring 20 and the second resin ring 30 on the ceramic substrate 10 on which the plurality of LED chips 60 have been provided; providing the first fluorescent-substance-containing resin layer 40 containing a first fluorescent substance in the first area 110 which is provided between the first resin ring 20 and the second resin ring 30; measuring a chromatic characteristic of the light-emitting device 100 in which the first fluorescent-substance-containing resin layer 40 has been provided; providing the second fluorescent-substance-containing resin layer 50, in accordance with the measurement result, in the second area 120 which is separated by the second resin ring 30; and measuring a chromatic characteristic of the light-emitting device 100 in which the second fluorescent-substance-containing resin layer 50 has been provided.

(Arrangement of LED Chips 60)

First, as shown in FIG. 3, the plurality of LED chips 60 are provided on the ceramic substrate 10 in such a manner that the plurality of LED chips 60 are arranged on a circle concentric with the first resin ring 20 and the second resin ring 30. The plurality of LED chips 60 are fixed by silicon resin. Then the plurality of LED chips 60 are wire-bonded with the patterned electrode wire 15 via the wires 70.

(Providing First Resin Ring 20 and Second Resin Ring 30)

As shown in FIG. 5, the first resin ring 20 and the second resin ring 30, which are partition walls, are provided on the ceramic substrate 10 on which the plurality of LED chips 60 have been provided.

The first resin ring 20 and the second resin ring 30 can be formed with the use of a dispenser. In the present embodiment, the first resin ring 20 and the second resin ring 30 are cured at a temperature of 150 degrees for 60 minutes. Note that the curing temperature and the curing time are not limited to those described above.

It is preferable that the first resin ring 20 and the second resin ring 30 are provided so as to partially cover the patterned electrode wire 15 and the wires 70. In the present embodiment, the plurality of LED chips 60 are provided and wire-bonded, and then the first resin ring 20 and the second resin ring 30 are provided. However, it is possible that the first resin ring 20 and the second resin ring 30 are provided first, and then the plurality of LED chips 60 are provided and wire-bonded.

(Providing First Fluorescent-Substance-Containing Resin Layer 40)

As shown in FIG. 5, the first fluorescent-substance-containing resin layer 40 containing a first fluorescent substance is provided in the first area 110 which is an area separated by the first resin ring 20 and the second resin ring 30.

Figure 8:
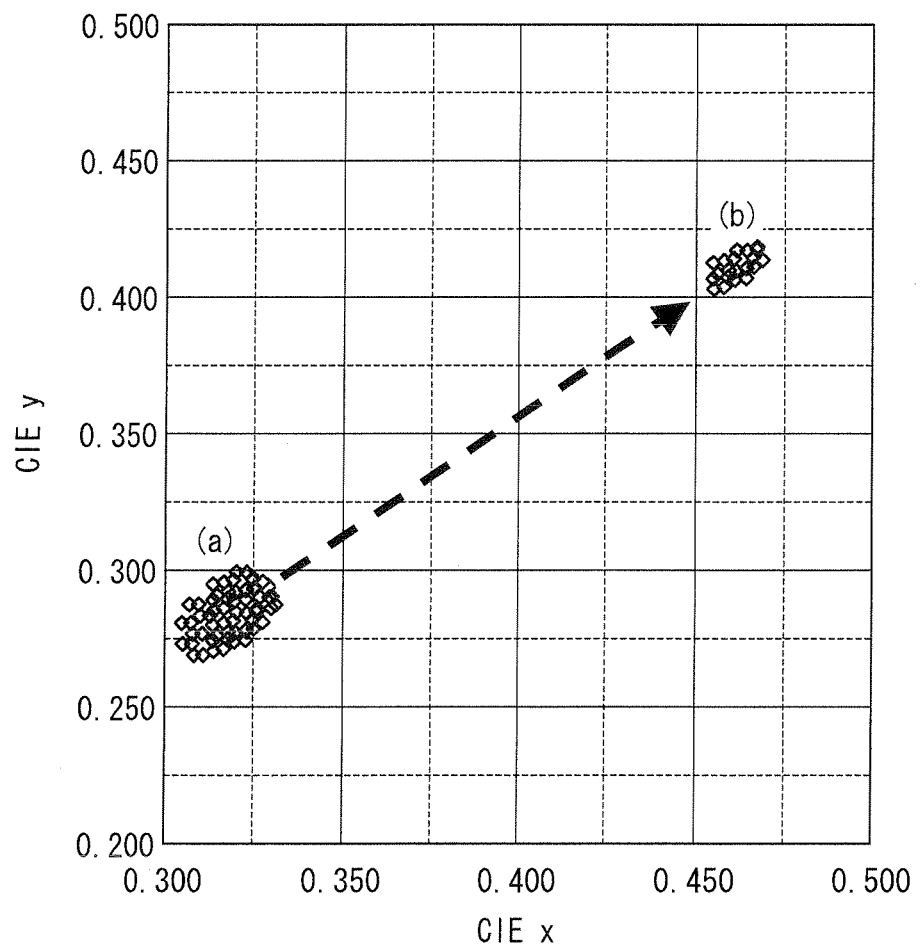
FIG. 8 is a graph illustrating chromaticity coordinates of CIE.

FIG. 8 is a graph illustrating chromaticity coordinates of CIE. (a) in FIG. 8 indicates a chromaticity range after the first fluorescent-substance-containing resin layer 40 is provided, and (b) in FIG. 8 indicates a chromaticity range after the second fluorescent-substance-containing resin layer 50 is provided.

The first fluorescent-substance-containing resin layer 40 is formed by filling the first area 110 with a mixture of the first fluorescent substance and a silicon resin which is a sealing material so that light can be emitted at (x, y)=(0.32, 0.285) of chromaticity coordinates of CIE in FIG. 8. In the present embodiment, the first fluorescent-substance-containing resin layer 40 is formed at a curing temperature of 150 degrees for 30 minutes. Note that the curing temperature and the curing time are not limited to those described above.

(First Measurement)

A chromatic characteristic of the light-emitting device 100 in which the first fluorescent-substance-containing resin layer 40 has been provided is measured. The first measurement of a chromatic characteristic is carried out by, for example, causing the 21 pieces of the LED chips 60 provided in the first area 110 and the 6 pieces of the LED chips 60 provided in the second area 120 to emit light.

The measured chromaticity range of the first fluorescent-substance-containing resin layer 40 is indicated by (a) in FIG. 8.

(Providing Second Fluorescent-Substance-Containing Resin Layer 50)

In accordance with the measurement result, the second fluorescent-substance-containing resin layer 50 containing a second fluorescent substance is provided in the second area 120 which is an area inside the second resin ring 30 (see FIG. 6).

The recitation "in accordance with the measurement result" means that an amount and a composition of a fluorescent substance to be contained in a resin which constitutes the second fluorescent-substance-containing resin layer 50 are determined in accordance with the chromatic characteristic of the light-emitting device 100 measured in the first measurement, and the second fluorescent-substance-containing resin layer 50 is provided so that a desired chromatic characteristic of the light-emitting device 100 can be obtained.

The second fluorescent-substance-containing resin layer 50 is formed by filling the second area 120 with a mixture of the second fluorescent substance and a silicon resin which is a sealing material so that the light-emitting device 100 emits light at (x, y)=(0.455, 0.415) in the chromaticity coordinates of CIE. In the present embodiment, the second fluorescent-substance-containing resin layer 50 is formed at a curing temperature of 150 degrees for 5 hours. Note that the curing temperature and the curing time are not limited to those described above.

The second fluorescent-substance-containing resin layer can have a hemispherical shape which is upwardly convexed.

(Second Measurement)

A chromatic characteristic of the light-emitting device 100 in which the second fluorescent-substance-containing resin layer 50 has been provided is measured. The second measurement of a chromatic characteristic is carried out by, for example, causing the 21 pieces of the LED chips 60 provided in the first area 110 and the 6 pieces of the LED chips 60 provided in the second area 120 to emit light. The measured chromaticity range is indicated by (b) in FIG. 8.

In the light-emitting device 100, the printed resistance element 80 is provided under the first resin ring 20. This makes it possible to further suppress absorption of light by the printed resistance element 80. Moreover, the first resin ring 20 protects an upper face (surface, etc) of the printed resistance element 80. Further, according to the configuration, a size of the light-emitting device 100 can be downsized even though the printed resistance element 80 is provided.

Note that, in the present embodiment, only a single first fluorescent-substance-containing resin layer 40 having a circular shape is provided for example. However, the number of the fluorescent-substance-containing resin layer is not limited to this, but a plurality of circular fluorescent-substance-containing resin layers can be provided concentrically. The light-emitting device having such a configuration can be suitably used as (i) a light source of an illuminating device, (e.g., a bulb-type illuminating device) having a circular shape with respect to its light emitting face or (ii) a light source of an illuminating device which needs to be appropriately optically-connected with an external optical component which illuminating device is provided with an external lens for adjusting a light distribution characteristic which external lens is provided directly above the illuminating device.

Embodiment 2

The following describes another embodiment of the present invention with reference to FIGS. 9 through 15. Note that, for convenience of explanation, the like numerals are given to components having functions similar to those in Embodiment 1, and explanations of the components are omitted. In the present embodiment, differences from Embodiment 1 are mainly discussed.

[Configuration of Light-Emitting Device 200]

Figure 9:
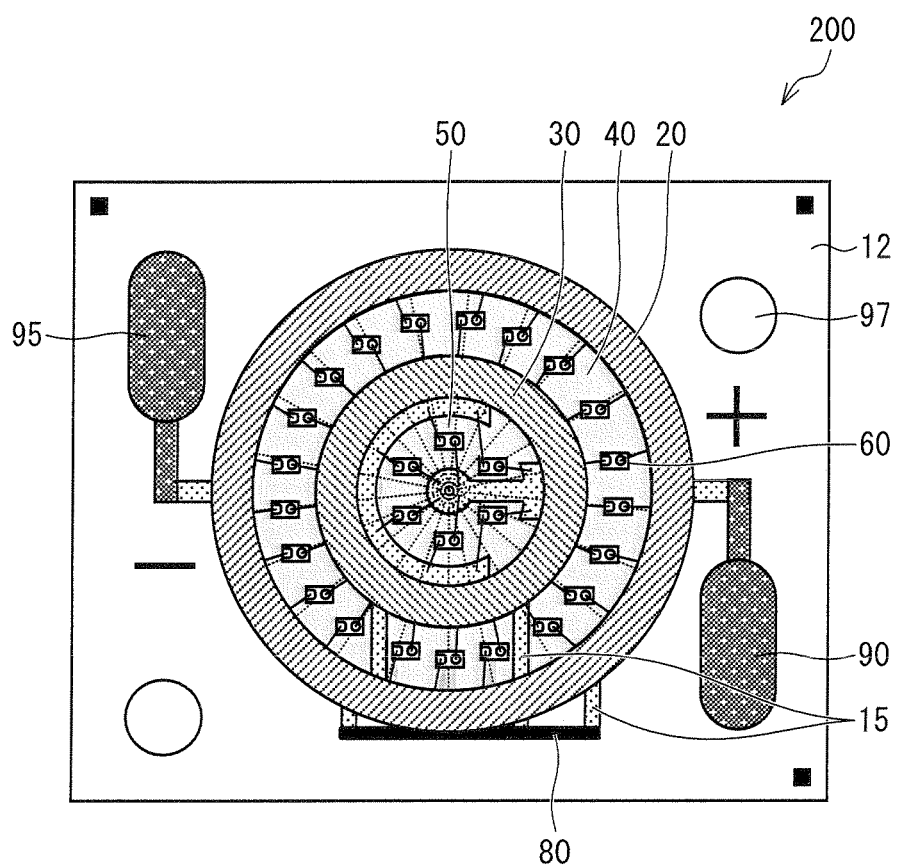
FIG. 9 is a top view illustrating a light-emitting device of Embodiment 2.

FIG. 9 is a top view illustrating a configuration example of a light-emitting device 200 of the present embodiment. As shown in FIG. 9, the light-emitting device 200 has the same configuration as the light-emitting device 100 of Embodiment 1 except that the light-emitting device 200 includes a ceramic substrate 12 instead of the ceramic substrate 10.

Figure 10:
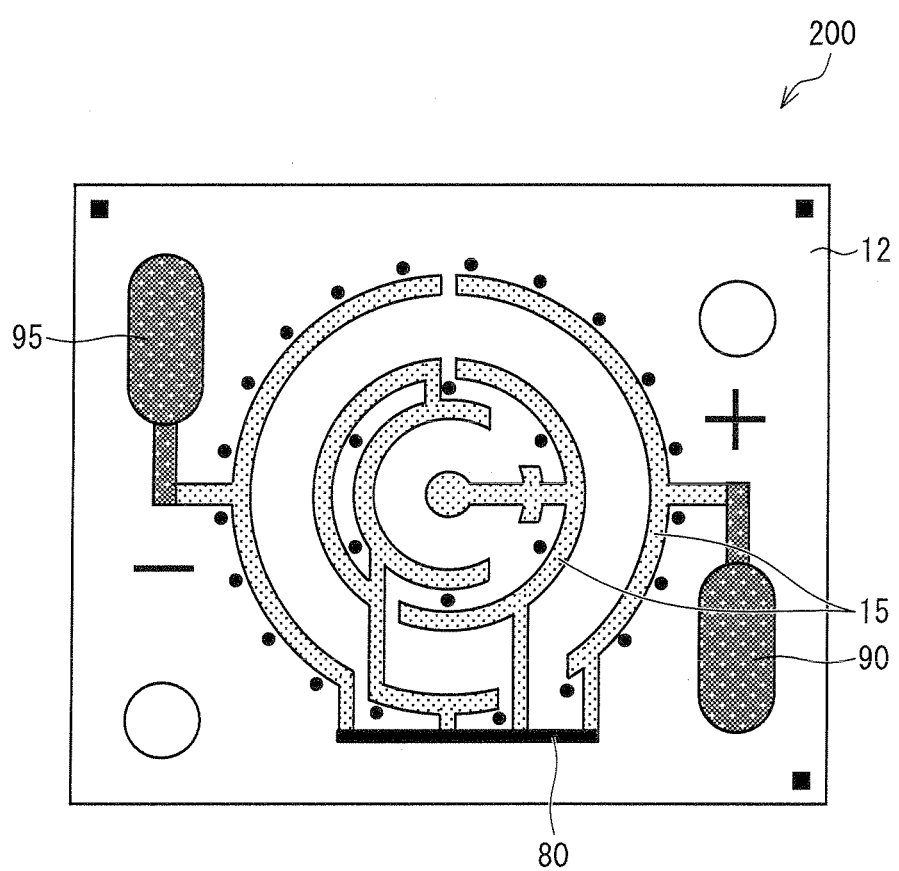
FIG. 10 is a top view illustrating a wiring pattern of the light-emitting device of Embodiment 2.
Figure 11:
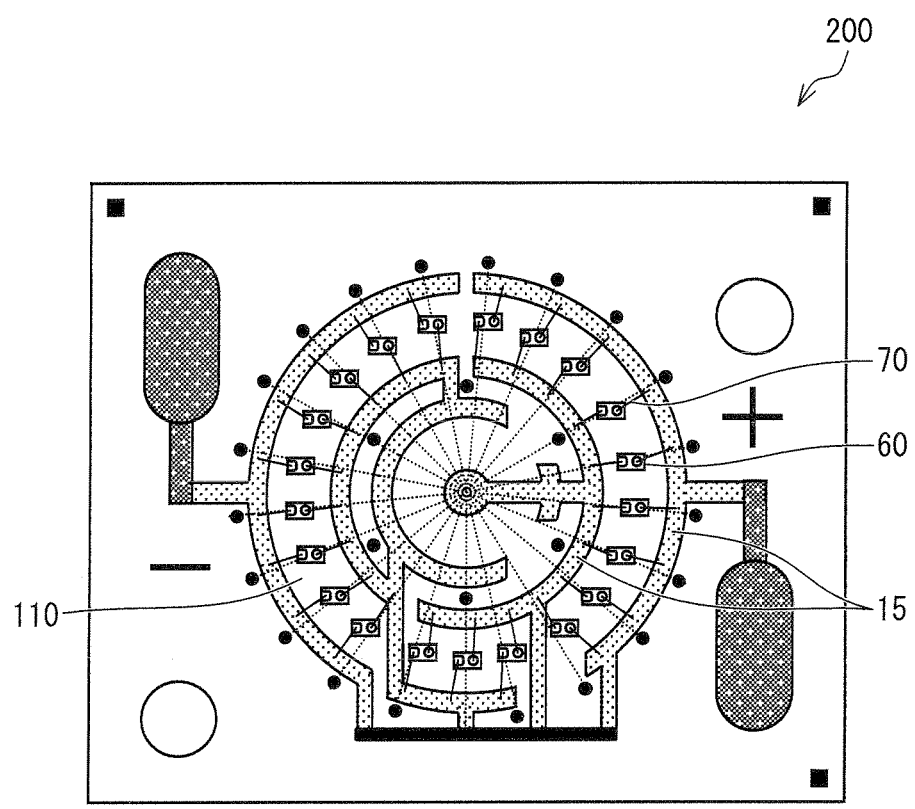
FIG. 11 is a top view illustrating an arrangement of LED chips in the light-emitting device of Embodiment 2.
Figure 12:
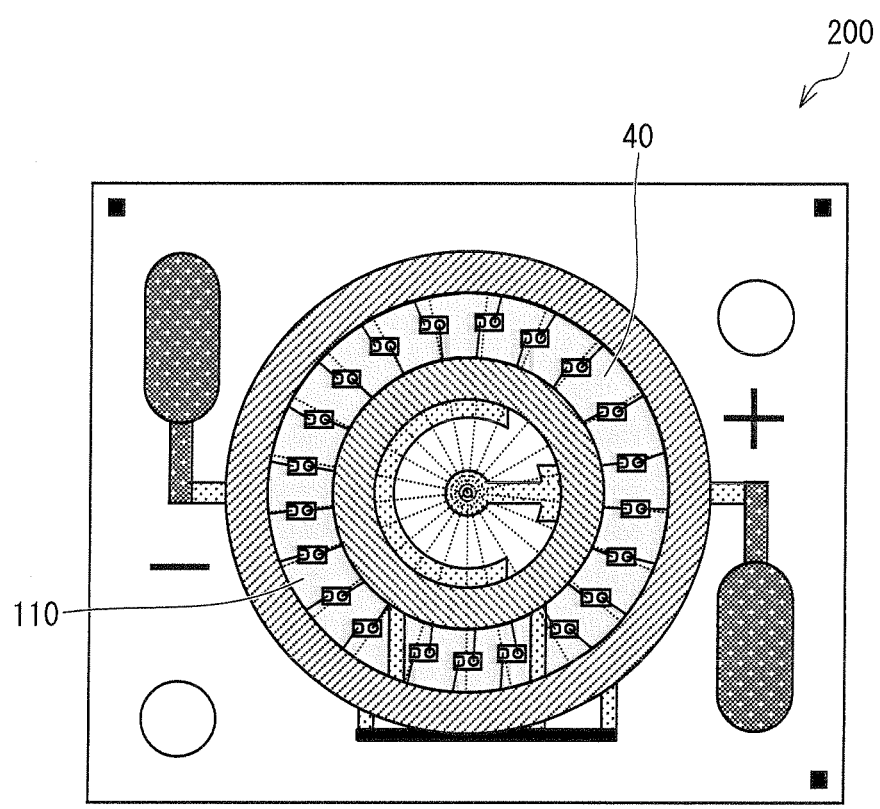
FIG. 12 is a top view illustrating a configuration in a first measurement of the light-emitting device of Embodiment 2.
Figure 13:
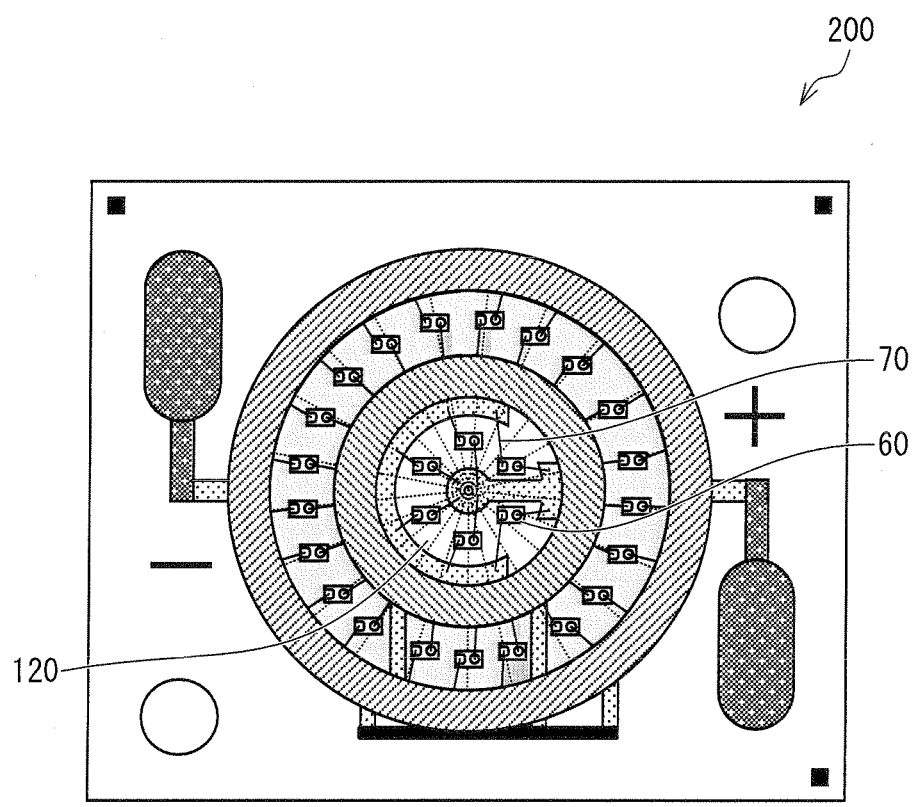
FIG. 13 is a top view illustrating an arrangement of the LED chips in the light-emitting device of Embodiment 2.
Figure 14:
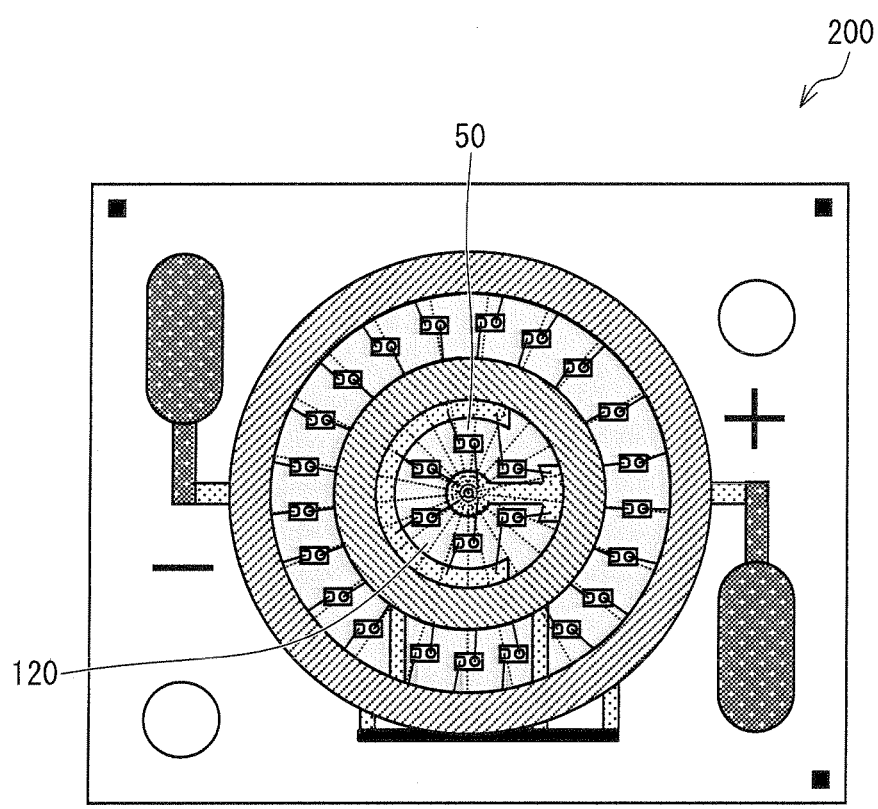
FIG. 14 is a top view illustrating a configuration in a second measurement of the light-emitting device of Embodiment 2.

FIG. 10 is a top view illustrating a configuration in which the ceramic substrate 12 is provided with a patterned electrode wire 15, an electrode land (anode) 90, an electrode land (cathode) 95, and a printed resistance element 80. FIG. 11 is a top view illustrating a configuration in which LED chips 60 in a first area 110 are connected to a patterned electrode wire 15 via wires 70. FIG. 12 is a top view illustrating a configuration in which a first fluorescent-substance-containing resin layer 40 is provided in the first area 110. FIG. 13 is a top view illustrating a configuration in which LED chips 60 in a second area 120 are connected to the patterned electrode wire 15 via wires 70. FIG. 14 is a top view illustrating a configuration in which a second fluorescent-substance-containing resin layer 50 is provided in the second area 120.

(Ceramic Substrate 12)

The ceramic substrate 12 has the same configuration as the ceramic substrate 10 of Embodiment 1 except that a thickness of the ceramic substrate 12 is 0.8 mm.

[Production Method of Light-Emitting Device 200]

In a method for producing the light-emitting device 200 of the present embodiment, the LED chips 60 are provided in the second area 120 after measuring a chromatic characteristic of the light-emitting device 200 in which the first fluorescent-substance-containing resin layer 40 has been provided, unlike the production method of Embodiment 1 in which the LED chips 60 are provided in the second area 120 before measuring a chromatic characteristic of the light-emitting device 100 in which the first fluorescent-substance-containing resin layer 40 has been provided.

(Providing LED Chips 60 in First Area 110)

As shown in FIG. 11, the LED chips 60 are provided in the first area 110 on the ceramic substrate 12 of FIG. 10 in which the patterned electrode wire 15, the electrode land (anode) 90, the electrode land (cathode) 95, and the printed resistance element 80 are provided. As shown in FIG. 11, 21 pieces of the LED chips 60 are provided in the first area 110 on a main surface of the ceramic substrate 12 and fixed by silicon resin.

(Providing of Resin Ring)

A first resin ring 20 and a second resin ring 30 are provided.

(Providing of First Fluorescent-Substance-Containing Resin Layer 40)

Then, the first fluorescent-substance-containing resin layer 40 is provided in the first area 110.

As shown in FIG. 12, the first fluorescent-substance-containing resin layer 40 containing a first fluorescent substance is provided in the first area 110 which is an area between the first resin ring 20 and the second resin ring 30.

Figure 15:
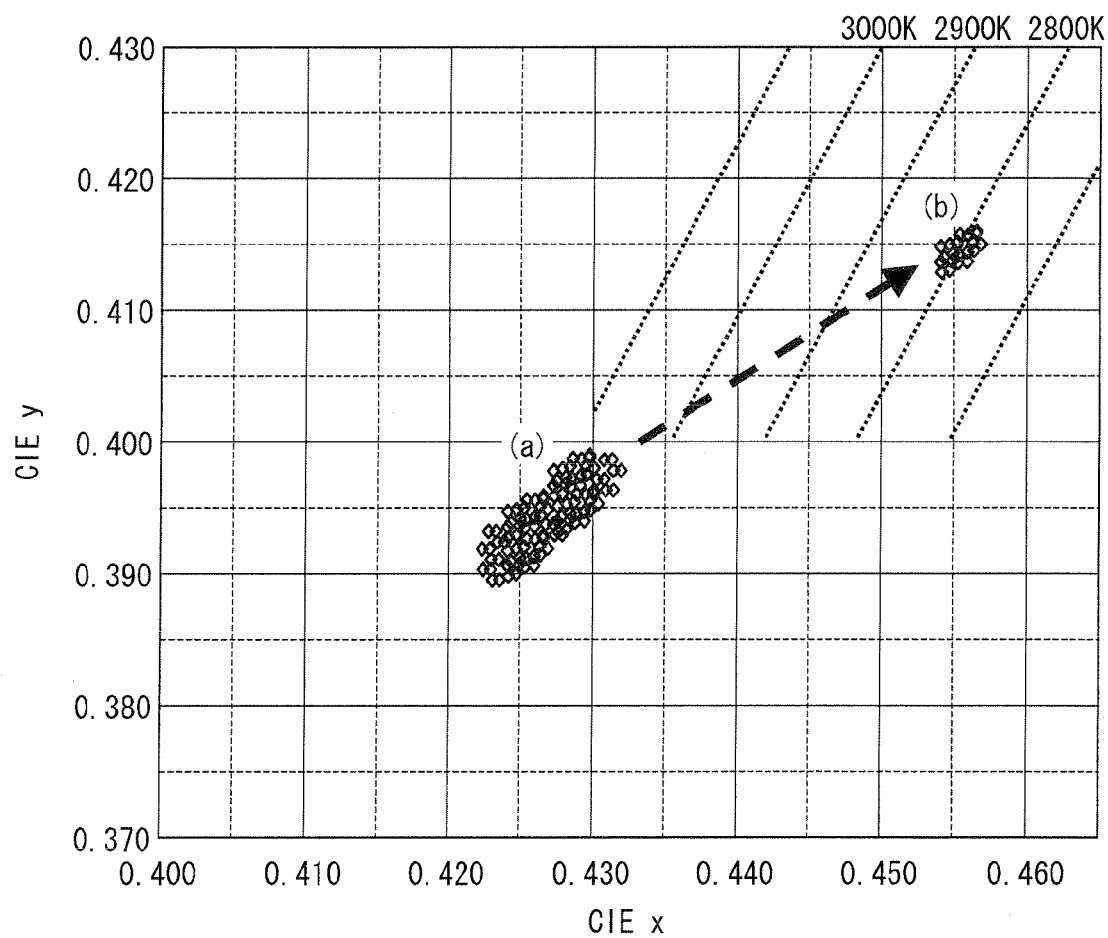
FIG. 15 is a graph illustrating chromaticity coordinates of CIE.

FIG. 15 is a graph illustrating chromaticity coordinates of CIE. (a) in FIG. 15 indicates a chromaticity range after the first fluorescent-substance-containing resin layer 40 is provided, and (b) in FIG. 15 indicates a chromaticity range after the second fluorescent-substance-containing resin layer 50 is provided.

The first fluorescent-substance-containing resin layer 40 is formed by filling the first area 110 with a mixture of the first fluorescent substance and a silicon resin which is a sealing material so that light can be emitted at (x, y)=(0.427, 0.395) of the chromaticity coordinates of CIE in FIG. 15. In the present embodiment, the first fluorescent-substance-containing resin layer 40 is formed at a curing temperature of 150 degrees for 30 minutes. Note that the curing temperature and the curing time are not limited to those described above.

(First Measurement)

A chromatic characteristic of the light-emitting device 200 in which the first fluorescent-substance-containing resin layer 40 has been provided is measured. The first measurement of a chromatic characteristic is carried out by, for example, causing the 21 pieces of the LED chips 60 provided in the first area 110 to emit light.

The measured chromaticity range of the first fluorescent-substance-containing resin layer 40 is indicated by (a) in FIG. 15.

(Providing LED Chips 60 in Second Area 120)

Then, as shown in FIG. 13, the LED chips 60 are provided in the second area 120. 6 pieces of the LED chips 60 are provided in the second area 120 on the main surface of the ceramic substrate 12 and fixed by silicon resin.

(Providing Second Fluorescent-Substance-Containing Resin Layer 50)

Subsequently, in accordance with the measurement result, the second fluorescent-substance-containing resin layer 50 is provided in the second area 120 (see FIG. 14). The second fluorescent-substance-containing resin layer 50 is formed by filling the second area 120 with a mixture of the second fluorescent substance and a silicon resin which is a sealing material so that light can be emitted at (x, y)=(0.455, 0.415) of the chromaticity coordinates of CIE. A curing temperature and a curing time for forming the second fluorescent-substance-containing resin layer 50 are not limited in particular. However, it is preferable that, for example, the curing temperature is 150 degrees and the curing time is 5 hours.

(Second Measurement)

A chromatic characteristic of the light-emitting device 200 in which the second fluorescent-substance-containing resin layer 50 has been provided is measured. The second measurement of the chromatic characteristic is carried out by, for example, causing the 21 pieces of the LED chips 60 provided in the first area 110 and the 6 pieces of the LED chips 60 provided in the second area 120 to emit light. The measured chromaticity range is indicated by (b) in FIG. 15.

Embodiment 3

Figure 16:
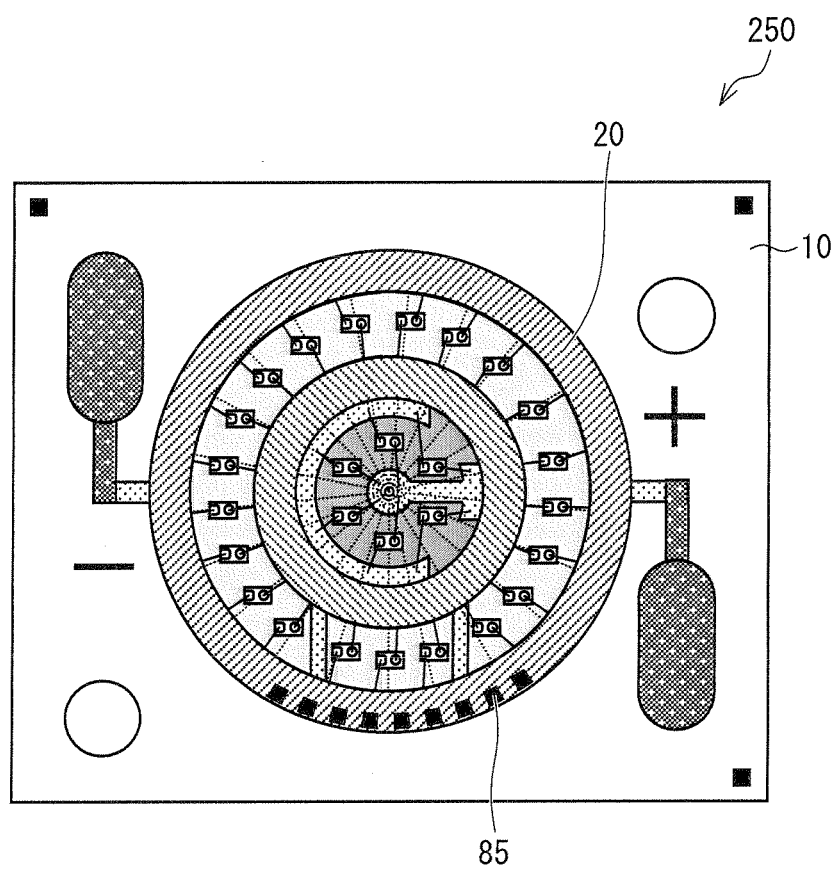
FIG. 16 is a top view illustrating a light-emitting device of Embodiment 3.

The following describes another embodiment of the present invention with reference to FIG. 16. Note that, for convenience of explanation, the like numerals are given to components having functions similar to those in Embodiment 1, and explanations of the components are omitted. In the present embodiment, differences from Embodiment 1 are mainly discussed.

[Configuration of Light-Emitting Device 250]

As shown in FIG. 16, the light-emitting device 250 has the same configuration as the light-emitting device 100 of Embodiment 1 except that the light-emitting device 250 includes a printed resistance element 85.

(Printed Resistance Element 85)

As shown in FIG. 16, the printed resistance element 85 has almost the same configuration as the printed resistance element 80 of Embodiment 1 except that the printed resistance element 85 is provided between the ceramic substrate 10 and the first resin ring 20, and the first resin ring 20 wholly covers the printed resistance element 85.

[Method for Producing Light-Emitting Device 250]

The light-emitting device 250 of the present embodiment is produced by the same way as that of Embodiment 1.

(First Measurement)

A chromatic characteristic of the light-emitting device 250 in which the first fluorescent-substance-containing resin layer 40 has been provided is measured. The first measurement of the chromatic characteristic is carried out by, for example, causing the 21 pieces of the LED chips 60 provided in the first area 110 and the 6 pieces of the LED chips 60 provided in the second area 120 to emit light.

(Second Measurement)

A chromatic characteristic of the light-emitting device 250 in which the second fluorescent-substance-containing resin layer 50 has been provided is measured. The second measurement of the chromatic characteristic is carried out by, for example, causing the 21 pieces of the LED chips 60 provided in the first area 110 and the 6 pieces of the LED chips 60 provided in the second area 120 to emit light.

Embodiment 4

Figure 17:
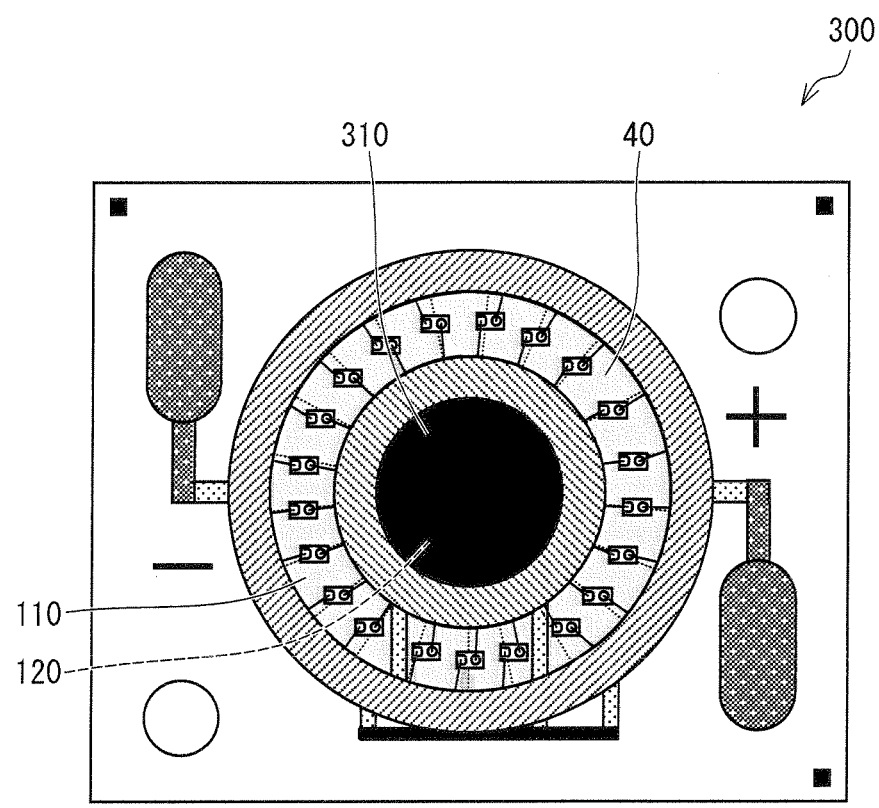
FIG. 17 is a top view illustrating a configuration in a first measurement of a light-emitting device of Embodiment 4.

The following describes another embodiment of the present invention with reference to FIG. 17. Note that, for convenience of explanation, the like numerals are given to components having functions similar to those in Embodiment 1, and explanations of the components are omitted. In the present embodiment, differences from Embodiment 1 are mainly discussed.

[Configuration of Light-Emitting Device 300]

FIG. 17 is a top view illustrating a light-emitting device 300 in which a first fluorescent-substance-containing resin layer 40 is provided in the first area 110 and a light-shielding plate 310 is provided in the second area 120. With this configuration, a first measurement of a chromatic characteristic is carried out. As shown in FIG. 17, the light-emitting device 300 has the same configuration as the light-emitting device 100 of Embodiment 1 except that the light-emitting device 300 includes the light-shielding plate 310.

(Light-Shielding Plate 310)

As shown in FIG. 17, the light-shielding plate 310 is provided so as to wholly cover the second area 120.

(Method for Producing Light-Emitting Device 300)

In a method for producing the light-emitting device 300 of the present embodiment, the light-shielding plate 310 is provided so as to cover the second area 120 before measuring a chromatic characteristic of the light-emitting device 300 in which the first fluorescent-substance-containing resin layer has been provided, unlike the production method of Embodiment 1 in which a chromatic characteristic of the light-emitting device 100 is measured after the first fluorescent-substance-containing resin layer 40 is provided.

(Providing Light-Shielding Plate 310)

On the ceramic substrate 10, the LED chips 60 are provided, the first resin ring 20 and the second resin ring 30 are provided, and the first fluorescent-substance-containing resin layer 40 is provided. After that, as shown in FIG. 17, the light-shielding plate 310 is provided so as to wholly cover the second area 120.

(First Measurement)

After the first fluorescent-substance-containing resin layer 40 and the light-shielding plate 310 are provided, a chromatic characteristic of the light-emitting device 300 is measured. The first measurement of the chromatic characteristic of the light-emitting device 300 is carried out by, for example, causing the 21 pieces of the LED chips 60 provided in the first area 110 and 6 pieces of the LED chips 60 provided in the second area 120 to emit light.

(Providing Second Fluorescent-Substance-Containing Resin Layer 50)

Then, the light-shielding plate 310 covering the second area 120 is removed and a second fluorescent-substance-containing resin layer 50 is provided in the second area 120.

(Second Measurement)

The chromatic characteristic of the light-emitting device 300 in which the second fluorescent-substance-containing resin layer 50 has been provided is measured. The second measurement of the chromatic characteristic of the light-emitting device 300 is carried out by, for example, causing the 21 pieces of the LED chips 60 provided in the first area 110 and the 6 pieces of the LED chips 60 provided in the second area 120 to emit light.

Embodiment 5

Figure 18:
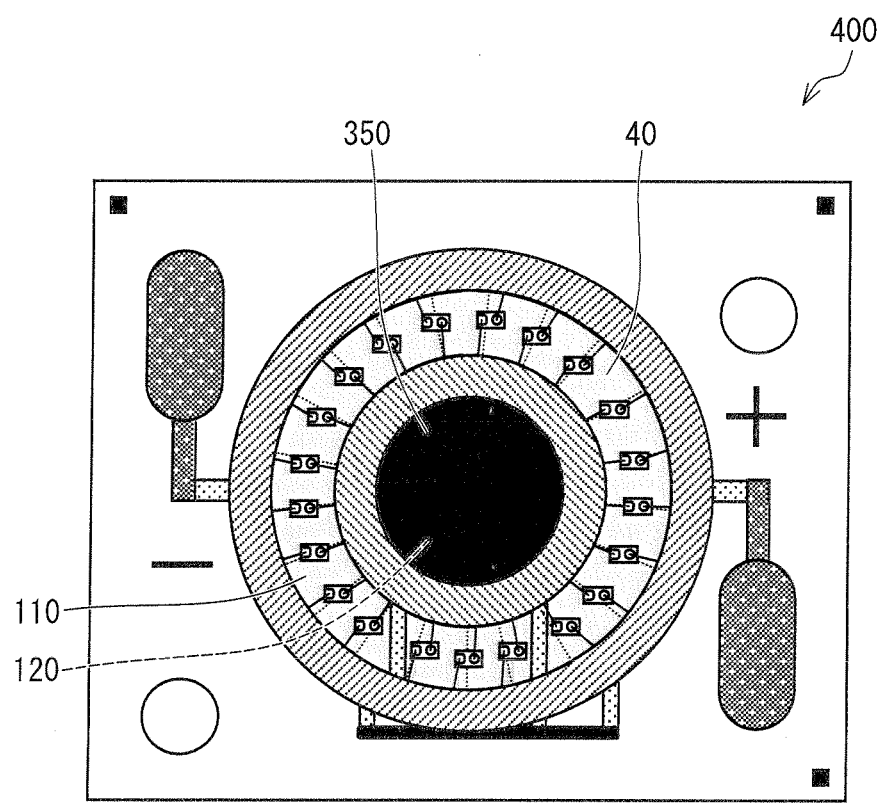
FIG. 18 is a top view illustrating a configuration in a second measurement of a light-emitting device of Embodiment 5.

The following describes another embodiment of the present invention with reference to FIG. 18. Note that, for convenience of explanation, the like numerals are given to components having functions similar to those in Embodiment 1, and explanations of the components are omitted. In the present embodiment, differences from Embodiment 1 are mainly discussed.

[Configuration of Light-Emitting Device 400]

FIG. 18 is a top view illustrating a light-emitting device 400 of the present embodiment. As shown in FIG. 18, the light-emitting device 400 has the same configuration as the light-emitting device 100 of Embodiment 1 except that the light-emitting device 400 includes a pseudo fluorescent sheet 350.

(Pseudo Fluorescent Sheet 350)

As shown in FIG. 18, the pseudo fluorescent sheet 350 is provided so as to cover the second area 120. The pseudo fluorescent sheet 350 is a resin sheet containing a fluorescent substance of predetermined amount and composition. Moreover, plural kinds of the pseudo fluorescent sheets 350 are provided which have various amounts and compositions of fluorescent substances. The pseudo fluorescent sheets 350 are used for determining a mixing amount and a composition of a fluorescent substance contained in the second fluorescent-substance-containing resin layer 50 used for adjusting a chromaticity.

(Method for Producing Light-Emitting Device 400)

In a method for producing the light-emitting device 400 of the present embodiment, (i) the pseudo fluorescent sheet 350 is provided so as to cover the second area 120 before providing the second fluorescent-substance-containing resin layer 50, (ii) a chromatic characteristic of the light-emitting device 400 is measured, and then (iii) the second fluorescent-substance-containing resin layer 50 is provided in accordance with the measurement result. This production method is different from that of Embodiment 1 in which the chromatic characteristic of the light-emitting device 100 is measured after the second fluorescent-substance-containing resin layer 50 is provided.

(First Measurement)

After the first fluorescent-substance-containing resin layer 40 is provided, a chromatic characteristic of the light-emitting device 400 is measured. The first measurement of the chromatic characteristic is carried out by causing the 21 pieces of the LED chips 60 provided in the first area 110 and 6 pieces of the LED chips 60 provided in the second area 120 to emit light.

(Providing Pseudo Fluorescent Sheet 350)

Then, the pseudo fluorescent sheet 350 is provided so as to cover the second area 120.

(Second Measurement)

After the pseudo fluorescent sheet 350 is provided, a second measurement of the chromatic characteristic is carried out with the pseudo fluorescent sheet 350. The second measurement is repeated with pseudo fluorescent sheets 350 replaced one after another so as to select a pseudo fluorescent sheet 350 with which a desired chromaticity, that is, (x, y)= (0.455, 0.415) can be obtained.

After that, the second fluorescent-substance-containing resin layer 50 is formed by mixing a second fluorescent substance and a silicon resin which is a sealing material so that a chromaticity to be obtained becomes the same as the chromaticity obtained by the pseudo fluorescent sheet 350. This is how the light-emitting device 400 is produced.

Embodiment 6

Figure 19:
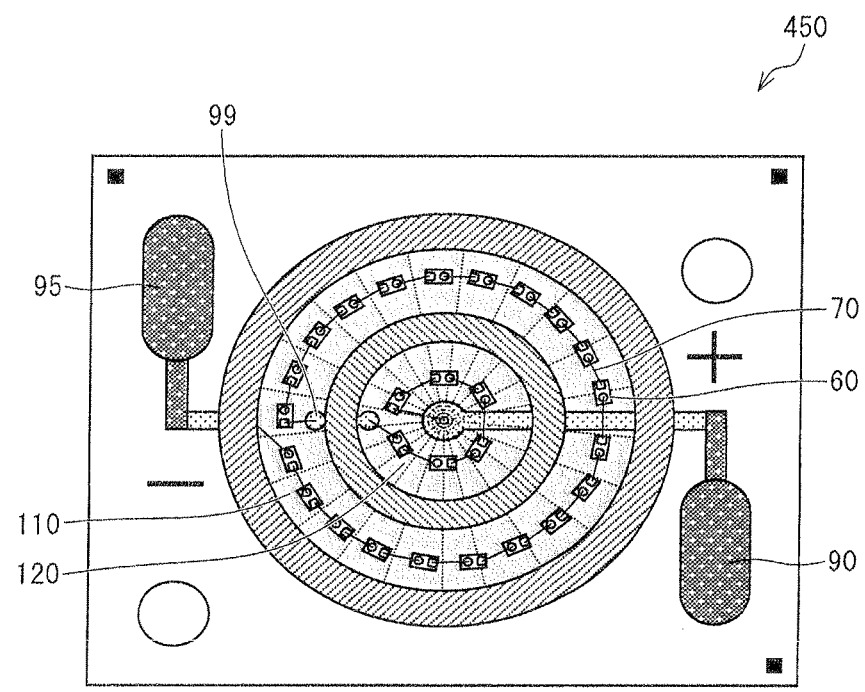
FIG. 19 is a top view illustrating a configuration of a light-emitting device of Embodiment 6.
Figure 20:
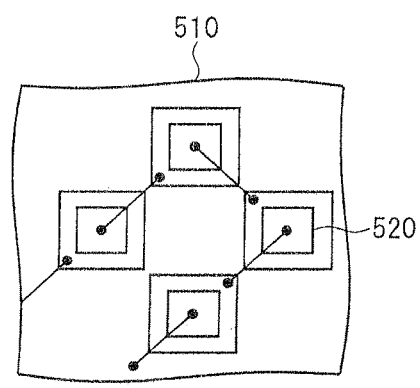
FIG. 20 is a view schematically illustrating an arrangement of LED chips of a conventional technique.

The following describes another embodiment of the present invention with reference to FIG. 19. Note that, for convenience of explanation, the like numerals are given to components having functions similar to those in Embodiment 1, and explanations of the components are omitted. In the present embodiment, differences from Embodiment 1 are mainly discussed.

[Configuration of Light-Emitting Device 450]

FIG. 19 is a top view illustrating a configuration in which LED chips 60 provided in the first area 110 and LED chips 60 provided in the second area 120 are connected to each other via a bridge electrode 99.

As shown in FIG. 19, the light-emitting device 450 has the same configuration as the light-emitting device 100 of Embodiment 1 except that the LED chips 60 are connected in series.

(Bridge Electrode 99)

The bridge electrode 99 connects, in series, (i) LED chips 60 connected in series in the first area 110 and (ii) LED chips 60 connected in series in the second area 120. Moreover, in the present embodiment, the bridge electrode 99 is narrower and thinner in a part traversing the second resin ring 30 than the other part of the bridge electrode 99, and both ends of the bridge electrode 99 which ends are connected to wires have circular shapes. With the configuration in which the bridge electrode 99 is formed to be narrower and thinner in the part traversing the second resin ring 30 than the other part of the bridge electrode 99, it is possible to prevent a problem that the first fluorescent-substance-containing resin layer 40 and the second fluorescent-substance-containing resin layer 50 are not separated into areas and are mixed together. That is, in a case where the bridge electrode 99 does not have the shape described above, it may occur that the bridge electrode 99 which is provided between the second resin ring 30 and the ceramic substrate 10 causes a gap therebetween, and accordingly the first fluorescent-substance-containing resin layer 40 and the second fluorescent-substance-containing resin layer 50 are not separated into areas and are mixed together. Note that the shape of the bridge electrode 99 is not limited to the shape described above.

(Providing LED Chips 60)

An end part of an electrode land 95 which end part is disposed in the first area 110 is connected to an electrode of a LED chip 60 via a wire 70. Then, an electrode of the LED chip 60 is connected to an electrode of an adjacent LED chip 60 via a wire 70. Subsequently, the rest of the LED chips 60 in the first area 110 are similarly connected in turn to each other via wires 70. An electrode of the 21st LED chip 60 is connected to the bridge electrode 99 via a wire 70, and the bridge electrode 99 is connected to an electrode of one of the LED chips 60 in the second area 120. With the configuration, the LED chips 60 in the first area 110 and the LED chip 60 in the second area 120 are connected to each other via the bridge electrode 99. Then, the LED chips 60 in the second area 120 are connected to each other in turn via wires 70. Lastly, an electrode of the 6th LED chip 60 is connected to an end part of an electrode land 90 via a wire 70. Accordingly, the electrode land 95 and the electrode land 90 are connected in series via the LED chips 60 and the bridge electrode 99.

(Method for Producing Light-Emitting Device 450)

A method for producing the light-emitting device 450 of the present embodiment is the same as the production method of Embodiment 1.

(First Measurement)

After the first fluorescent-substance-containing resin layer 40 is provided, the first measurement of a chromatic characteristic of the light-emitting device 450 is carried out by, for example, causing the 21 pieces of the LED chips 60 provided in the first area 110 and 6 pieces of the LED chips 60 provided in the second area 120 to emit light.

(Second Measurement)

Then, after the second fluorescent-substance-containing resin layer 50 is provided in the second area 120, the chromatic characteristic of the light-emitting device 450 is measured. The second measurement is carried out by, for example, causing the 21 pieces of the LED chips 60 provided in the first area 110 and the 6 pieces of the LED chips 60 provided in the second area 120 to emit light.

In the light-emitting device of the present invention, it is preferable that the partition wall (i) is formed on the substrate in such a manner that the partition wall has a circular shape or a cyclic polygonal shape when the substrate is viewed from above and (ii) includes at least two partition walls which are formed concentrically.

According to the configuration, it is possible to provide the light-emitting devices among which unevenness of chromaticities thereof is reduced. The light-emitting device can be suitably used, for example, as a light source of an illuminating device having a circular shape with respect to its light emitting face, or as a light source of an illuminating device which needs to be optically connected with an external optical component appropriately. The illuminating device having a circular shape with respect to its light emitting face can be, for example, a bulb-type illuminating device. The illuminating device which needs to be optically connected with an external optical component appropriately can be, for example, an illuminating device which is provided with an external lens for adjusting a light distribution characteristic which external lens is provided directly above the illuminating device.

In the light-emitting device of the present invention, it is preferable that the plurality of light-emitting elements are provided along a circle which is concentric with the partition wall.

According to the configuration, it is possible to provide the light-emitting devices among which unevenness of chromaticities thereof is reduced. The light-emitting device can be suitably used, for example, as a light source of an illuminating device having a circular shape with respect to its light emitting face, or as a light source of an illuminating device which needs to be optically connected with an external optical component appropriately. The illuminating device having a circular shape with respect to its light emitting face can be, for example, a bulb-type illuminating device. The illuminating device which needs to be optically connected with an external optical component appropriately can be, for example, an illuminating device which is provided with an external lens for adjusting a light distribution characteristic which external lens is provided directly above the illuminating device.

In the light-emitting device of the present invention, it is preferable that the sealing material in each of the plurality of areas is different in at least one of fluorescent substance content and fluorescent substance composition.

According to the configuration, it is possible that one of the sealing materials is provided in a certain area and a chromaticity is measured, and then an amount and a composition of a fluorescent substance contained in the other sealing material to be provided in the other area can be determined based on the measurement result. This makes it possible to provide the light-emitting devices among which unevenness of chromaticities thereof is reduced.

In the light-emitting device of the present invention, it is preferable that the sealing material contains plural kinds of fluorescent substances.

According to the configuration, it is possible to provide the light-emitting device which includes a plurality of fluorescent substances and accordingly capable of emitting light of a substantially desired color.

In the light-emitting device of the present invention, it is preferable that the partition wall is colored with milky white or white.

According to the configuration, it is possible to prevent the partition wall from absorbing light emitted by the plurality of light-emitting elements. This makes it possible to prevent the partition wall from weakening the light emitted by the plurality of light-emitting elements.

In the light-emitting device of the present invention, it is preferable that the plurality of light-emitting elements are separated into a plurality of groups in which light-emitting elements in a same group are connected to each other via a patterned wire(s).

According to the configuration, turning on or off of the plurality of light-emitting elements can be controlled for each of the plurality of groups. This makes it possible to measure more detailed chromatic characteristics of the light-emitting devices, and accordingly unevenness among the chromaticities can be reduced.

It is preferable that the light-emitting device of the present invention further includes at least one of a protective element and a printed resistor, between a main surface of the substrate and the partition wall.

According to the configuration, at least one of the protective element and the printed resistor is provided between the main surface of the substrate and the partition wall. This makes it possible to (i) reduce an amount of light, which is emitted by the light-emitting element, absorbed by at least one of the protective element and the printed resistor and (ii) protect a surface of at least one of the protective element and the printed resistor.

In the light-emitting device of the present invention, it is preferable that the at least one of the protective element and the printed resistor is wholly covered with the partition wall.

According to the configuration, at least one of the protective element and the printed resistor is wholly covered with the partition wall. This makes it possible to (i) reduce an amount of light, which is emitted by the light-emitting element, absorbed by at least one of the protective element and the printed resistor and (ii) protect a surface of at least one of the protective element and the printed resistor.

In the light-emitting device of the present invention, it is preferable that the substrate is further provided with a first electrode land for external connection and a second electrode land for external connection which (i) are respectively provided on both end areas of the main surface of the substrate and (ii) are not covered with the sealing material.

According to the configuration, a conductive wire can be easily and directly connected to the electrode land with the use of, for example, solder.

In the light-emitting device of the present invention, it is preferable that the substrate is provided with a bridge electrode with which one of the plurality of light-emitting elements embedded in a first area is connected to another one of the plurality of light-emitting elements embedded in a second area, the first area and the second area being areas among the plurality of areas.

According to the configuration, the light-emitting elements embedded in respectively different areas can be connected to each other.

In the light-emitting device of the present invention, it is preferable that the bridge electrode is provided between the substrate and the partition wall and traverses the partition wall.

According to the configuration, it does not need to newly prepare a space for providing the bridge electrode. This makes it possible to provide the light-emitting device whose size is not enlarged for providing the bridge electrode.

In the light-emitting device of the present invention, it is preferable that a part of the bridge electrode which part traverses the partition wall is thinner than the other part of the bridge electrode.

According to the configuration, in the part where the bridge electrode traverses the partition wall, it is possible to shorten a distance between the partition wall and the substrate which distance is occurred due to a thickness of the bridge electrode. This makes it possible to provide the light-emitting device which can prevent a problem that the sealing materials are not separated into each of the areas and accordingly mixed together, since the bridge electrode is provided.

In the light-emitting device of the present invention, it is preferable that the plurality of light-emitting elements are connected in series via the bridge electrode.

According to the configuration, an area of a metal surface is not small on the substrate. This makes it possible to provide the light-emitting device in which (i) reflection ratio of light emitted from the light-emitting elements is improved, (ii) deterioration of the metal surface is reduced, and (iii) adhesivity between the sealing material and the substrate is improved.

In the light-emitting device of the present invention, it is preferable that the partition wall contains at least one of a thickener and a diffusing agent.

According to the configuration, it is possible to give light reflectivity to the partition wall and to prevent the partition wall from absorbing light emitted from the plurality of light-emitting elements. This makes it possible to provide the light-emitting device which can prevent the partition wall from weakening the light emitted by the plurality of light-emitting elements.

In the method for producing the light-emitting device of the present invention, it is preferable that the step (a) includes (g) providing, before the step (d), some of the plurality of light-emitting elements in one of the areas separated by the partition wall, and (h) providing, after the step (d), rest of the plurality of light-emitting elements in the other one of the areas in which the second sealing material is to be formed.

According to the configuration, a chromatic characteristic of the light-emitting device in which the first sealing material has been provided can be measured regardless of light-emission by the plurality of light-emitting elements provided in the other one of the areas in which the second sealing material is to be formed. This makes it possible to carry out more detailed measurement of the chromatic characteristic of the light-emitting device in which the first sealing material has been formed.

It is preferable that the method for producing the light-emitting device of the present invention further includes the step of (i) providing, before the step (d), a light-shielding plate in such a manner that the light-shielding plate covers the second sealing material.

According to the configuration, a chromatic characteristic of the light-emitting device in which the first sealing material has been provided can be measured regardless of light-emission by the plurality of light-emitting elements provided in the other one of the areas in which the second sealing material is to be formed. This makes it possible to carry out more detailed measurement of the chromatic characteristic of the light-emitting device in which the first sealing material has been formed.

It is preferable that the method for producing the light-emitting device of the present invention includes the steps of: (j) providing, instead of the step (e), a pseudo fluorescent sheet so that the pseudo fluorescent sheet covers the other one of the areas in which the second sealing material is to be formed; and (k) measuring a chromatic characteristic of the light-emitting device in which the pseudo fluorescent sheet has been provided.

According to the configuration, it is possible to measure the chromatic characteristic of the light-emitting device without providing the second sealing material. Accordingly, it is possible that the pseudo fluorescent sheet is selected so that a desired chromaticity can be obtained and the second sealing material is formed in accordance with the pseudo fluorescent sheet. This provides an effect of easily producing the light-emitting devices among which unevenness of chromaticities thereof is reduced.

The present invention is not limited to the description of the embodiments above, but can be altered by a skilled person in the art within the scope of the claims. An embodiment derived from a proper combination of technical means disclosed in respective different embodiments is also encompassed in the technical scope of the present invention.

INDUSTRIAL APPLICABILITY

The light-emitting device of the present invention and the method for producing the light-emitting device can be suitably applied to a light source of an illuminating device, a light source of a backlight of a liquid crystal display, or the like.

REFERENCE SIGNS LIST 10 and 12: Ceramic substrate (substrate)
15: Patterned electrode wire
16: First electric area
17: Second electric area
18: Third electric area
20: First resin ring (partition wall)
30: Second resin ring (partition wall)
40: First fluorescent-substance-containing resin layer (sealing material, first sealing material)
50: Second fluorescent-substance-containing resin layer (sealing material, second sealing material)
60: LED chip
70: Wire
80 and 85: Printed resistance element
90: Electrode land (anode) (first electrode land for external connection)
95: Electrode land (cathode) (second electrode land for external connection)
97: Hole for mounting a substrate
99: Bridge electrode
100, 200, 250, 300, 400, and 450: Light-emitting device
110: First area (area)
120: Second area (area)
310: Light-shielding plate
350: Pseudo fluorescent sheet
510: Base substrate
520: LED chip

The invention claimed is:

1. A light-emitting device comprising:
a plurality of light-emitting elements provided on a substrate; and
a sealing material in which the plurality of light-emitting elements are embedded, the sealing material containing a fluorescent substance and being divided into a plurality of continuous areas by a partition wall, wherein
each of the plurality of continuous areas is annular or circular, seen from a top view, as a result of the partition wall, and
each of the plurality of continuous areas is not divided into smaller segments by the partition wall comprising resin and by any other partition walls.

2. The light-emitting device as set forth in claim 1, wherein:
the partition wall comprising the resin (i) is formed on the substrate in such a manner that the partition wall comprising the resin has a circular shape or a cyclic polygonal shape when the substrate is viewed from above and (ii) includes at least two partition walls which comprises the resin and are formed concentrically,
the sealing material contains plural kinds of fluorescent substances,
the sealing material in each of the plurality of continuous areas is different in at least one of fluorescent substance content and fluorescent substance composition,
the substrate is further provided with a first electrode land for external connection and a second electrode land for external connection which (i) are respectively provided on both end areas of the substrate and (ii) are not covered with the sealing material,
the first electrode land for external connection and the second electrode land for external connection are connected to a patterned electrode wire provided on the substrate, and
electric power is supplied via the patterned electrode wire to the plurality of light-emitting elements included in the plurality of continuous areas.

3. The light-emitting device as set forth in claim 2, wherein:
the plurality of light-emitting elements are provided along a circle which is concentric with the partition wall comprising the resin.

4. The light-emitting device as set forth in claim 1, wherein:
the sealing material in each of the plurality of continuous areas is different in at least one of fluorescent substance content and fluorescent substance composition.

5. The light-emitting device as set forth in claim 1, wherein:
the sealing material contains plural kinds of fluorescent substances.

6. The light-emitting device as set forth in claim 1, wherein:
the partition wall comprising the resin is colored with milky white or white.

7. The light-emitting device as set forth in claim 1, wherein:
the plurality of light-emitting elements are separated into a plurality of groups in which light-emitting elements in a same group are connected to each other via a patterned wire(s).

8. The light-emitting device as set forth in claim 1, further comprising:
at least one of a protective element and a printed resistor, between a main surface of the substrate and the partition wall comprising the resin.

9. The light-emitting device as set forth in claim 8, wherein:
the at least one of the protective element and the printed resistor is wholly covered with the partition wall comprising the resin.

10. The light-emitting device as set forth in claim 1, wherein:
the substrate is further provided with a first electrode land for external connection and a second electrode land for external connection which (i) are respectively provided on both end areas of the main surface of the substrate and (ii) are not covered with the sealing material.

11. The light-emitting device as set forth in claim 1, wherein:
the substrate is provided with a bridge electrode with which one of the plurality of light-emitting elements embedded in a first area is connected to another one of the plurality of light-emitting elements embedded in a second area, the first area and the second area being areas among the plurality of continuous areas.

12. The light-emitting device as set forth in claim 11, wherein:
the bridge electrode is provided between the substrate and the partition wall comprising the resin and traverses the partition wall comprising the resin.

13. The light-emitting device as set forth in claim 11, wherein:
the plurality of light-emitting elements are connected in series via the bridge electrode.

14. The light-emitting device as set forth in claim 1, wherein:
the partition wall comprising the resin contains at least one of a thickener and a diffusing agent.

* * * * *